United States Patent [19]

Oshiba

[11] Patent Number: 5,239,126
[45] Date of Patent: Aug. 24, 1993

[54] HIGH-FREQUENCY CIRCUIT PACKAGE
[75] Inventor: Katsuyuki Oshiba, Kanagawa, Japan
[73] Assignee: Sony Corporation, Tokyo, Japan
[21] Appl. No.: 641,867
[22] Filed: Jan. 16, 1991
[30] Foreign Application Priority Data Jan. 17, 1990 [JP] Japan .................................. 2-007978

[51] Int. Cl.$^5$ ........................... H05K 9/00; H02G 3/18
[52] U.S. Cl. .............................. 174/35 R; 174/65 R; 174/262; 361/774; 361/777; 361/818
[58] Field of Search ............... 174/35 R, 35 MS, 52.1, 174/52.4, 65 R, 250, 260, 262, 263; 361/424, 392, 399, 406, 409

[56] References Cited

U.S. PATENT DOCUMENTS 4,658,334 4/1987 McSparran et al. ................. 361/415
5,014,160 5/1991 McCoy, Jr. ........................ 174/35 R

FOREIGN PATENT DOCUMENTS 50-29313 9/1975 Japan ........................... 174/152 GM
0490203 10/1975 U.S.S.R. ....................... 174/152 GM Primary Examiner—Leo P. Picard
Assistant Examiner—Bot Ledynh
Attorney, Agent, or Firm—Hill, Steadman & Simpson

[57] ABSTRACT

A high-frequency circuit package including a conductive substrate, and upper and lower shielding cases which come tightly into contact with opposite surfaces of the conductive substrate to define therein upper and lower shielding chambers. High-frequency circuits are mounted on the surfaces of the conductive substrate within the upper and lower chambers, respectively.

13 Claims, 4 Drawing Sheets

HIGH-FREQUENCY CIRCUIT PACKAGE

BACKGROUND OF THE INVENTION

The present invention relates generally to a high-frequency circuit package which prevents leakage of electromagnetic waves between a high-frequency circuit and another circuit. More specifically, the invention relates to a high-frequency circuit package which prevents electromagnetic waves produced by a high-frequency circuit from exerting an unfavorable influence upon other circuits and/or preventing electromagnetic waves produced from other circuits from exerting an unfavorable influence upon the high-frequency circuit.

Generally, it is known to install a high-frequency circuit within a high-frequency circuit package in order to prevent electromagnetic waves produced by the high-frequency circuit from exerting an unfavorable influence on other circuits or to prevent electromagnetic waves produced by other circuits from exerting unfavorable influence on the high-frequency circuit. FIG. 1 shows a conventional high frequency circuit package 100. The high-frequency circuit package 100 generally comprises a conductive substrate 102, a shielding wall 104 and a shielding case 106. The shielding wall 104 projects upwards from the upper surface of the conductive substrate 102 and surrounds an essentially rectangular space. The shielding case 106 is arranged on the shielding wall 104 to define therein a shielding chamber 108.

A high-frequency circuit 110 comprising an integrated circuit 112, a semiconductor device 114 and so forth, is packaged in the shielding chamber 108. Input and output signals between the high-frequency circuit 110 and external circuits are performed via leads 116 provided in the shielding wall 104. In addition, input and output of continuous current between the high-frequency circuit 110 and external circuits is accomplished via leads 118 provided in the shielding wall 104.

In this conventional package, since high-frequency circuits having different functions from each other cannot be packaged in the same shielding chamber, one package houses therein only one high-frequency circuit. In order to connect a plurality of high-frequency circuits 110 to each other, the respective packages 110 secured to a main substrate 120 must be connected to each other by means of microstrip lines 122, as shown in FIG. 2. For that reason, a disadvantage arises in that the space for housing therein all of the circuits becomes great, and thus packaging density is low.

In addition, since one package can house therein only one high-frequency circuit 110 as mentioned above, two related high-frequency circuits 110 having different functions from each other, e.g., an oscillating circuit and an amplifying circuit, must be housed within separate packages 100, respectively. Therefore, the disadvantage arises in that the number of electrical connections of the packages 100 to each other becomes great so that reliability of the circuits decreases.

SUMMARY OF THE INVENTION

The present invention provides the ability to increase the number of electronic circuits which can be packaged in one high-frequency circuit package thereby increasing the packaging density of the circuits.

The present invention also provides an improved high-frequency circuit package which can house therein a pair of high-frequency circuits having different functions and being related to each other, to decrease the number of connections of packages to each other so as to improve reliability of the circuits.

To these ends, in an embodiment, the invention provides a high-frequency circuit package, with shielding cases mounted on both surfaces of a conductive substrate to form two shielding chambers on the upper and lower sides of the conductive substrate, so as to mount high-frequency circuits on the conductive substrate within the respective shielding cases. With this construction, since one package has two shield chambers to house therein two high-frequency circuits, packaging density can be increased. In addition, if two related high-frequency circuits having different functions can be housed within the respective shielding chambers, one of the high-frequency circuits can be electrically connected to the other within the package so that the number of electrical connections between the packages can be decreased.

According to one aspect of the present invention, a high-frequency circuit package comprises: a conductive substrate; a first shielding case associated with a first surface of the conductive substrate to define therein a first shielding chamber; a second shielding case associated with a surface opposite the first surface of the conductive substrate to define therein a second shielding chamber; a pair of high-frequency circuits, one of which is mounted on the first surface of the conductive substrate within the first shielding case, and the other of which is mounted on the opposite surface of the conductive substrate within the second shielding case.

The present invention will be understood more fully from the following detailed description and the accompanying drawings of the preferred embodiments of the invention. However, the drawings are not intended to imply limitation of the invention to a specific embodiment, but are for explanation and understanding only.

DETAILED DESCRIPTION OF THE PRESENTLY PREFERRED EMBODIMENTS

Figure 1:
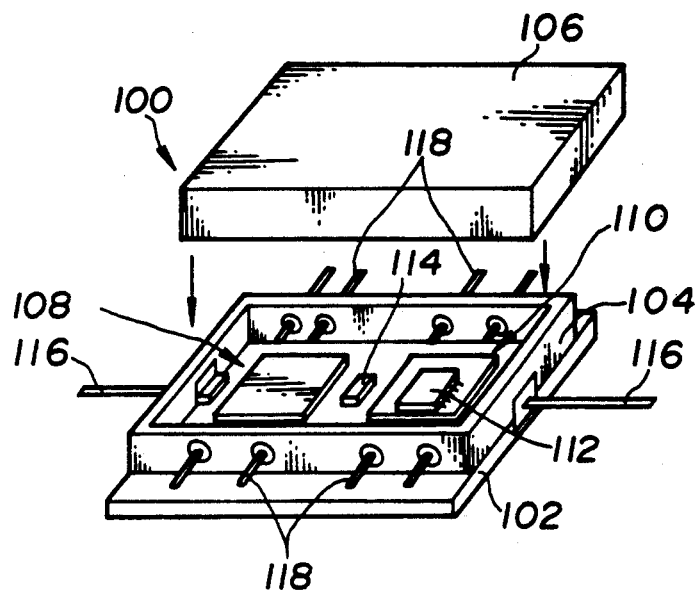
FIG. 1 is a perspective view of a conventional high-frequency circuit package.
Figure 2:
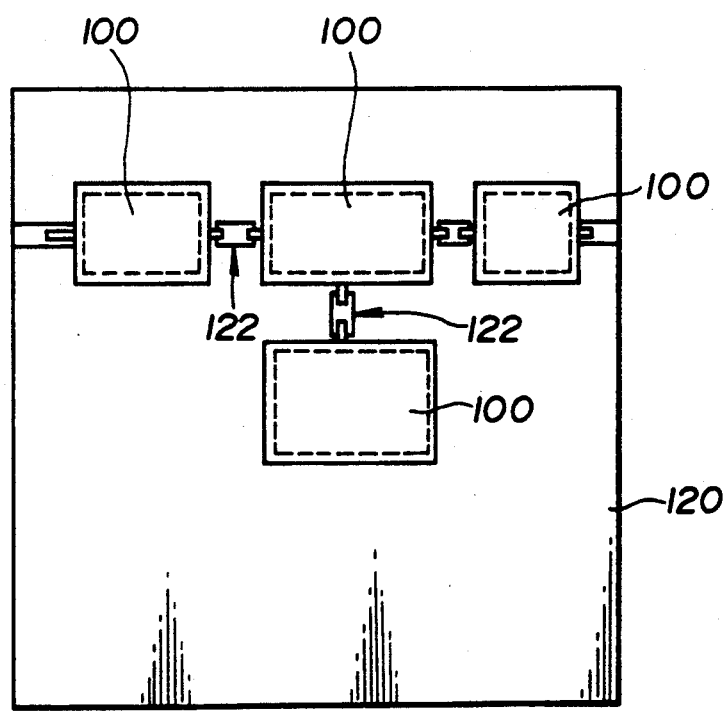
FIG. 2 is a plan view illustrating electrical connections between the high-frequency circuit packages of FIG. 1.
Figure 3:
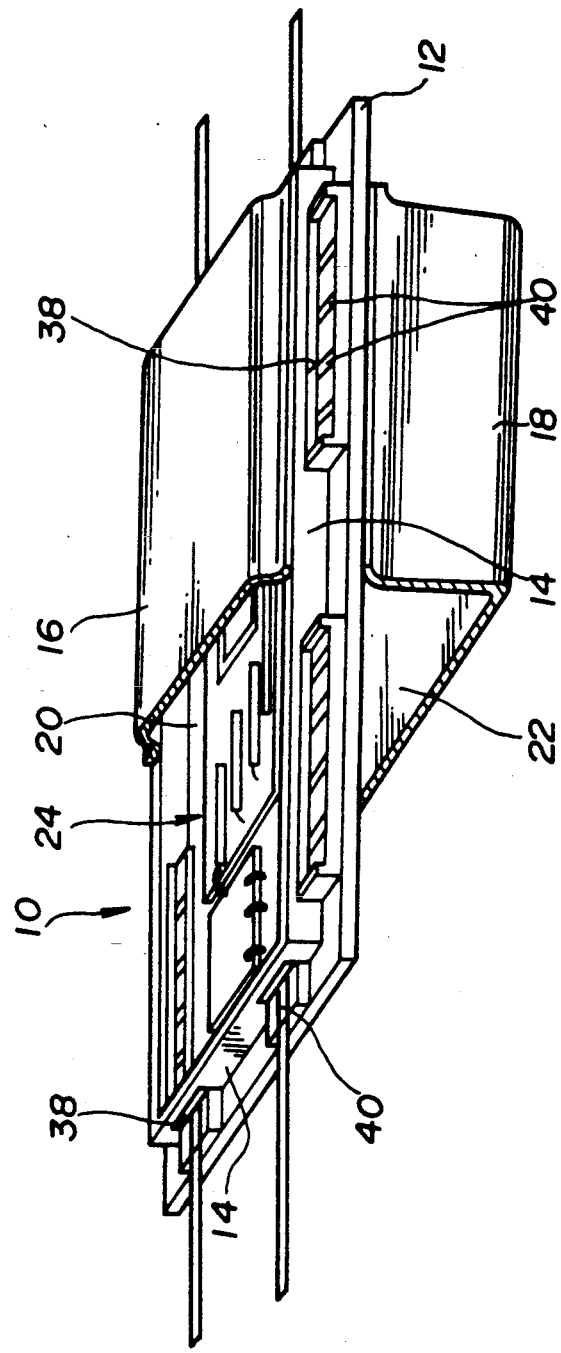
FIG. 3 is a perspective view of a high-frequency circuit package, according to the present invention.
Figure 4:
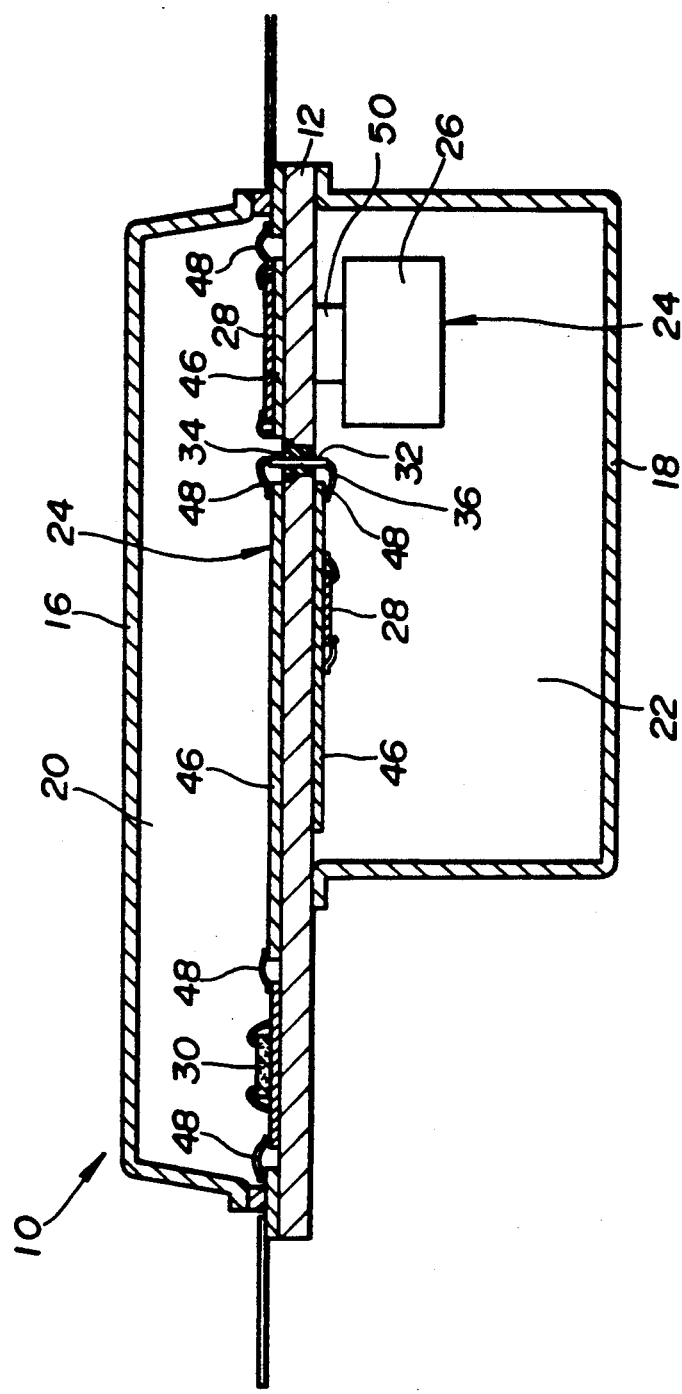
FIG. 4 is a sectional view of the high-frequency circuit package of FIG. 3.

Referring now to the drawings, particularly to FIGS. 3 and 4, there is illustrated a preferred embodiment of a high-frequency circuit package 10 according to the present invention.

The high-frequency circuit package 10 generally comprises an essentially rectangular conductive substrate 12, a shielding wall 14, and upper and lower shielding cases 16 and 18. The shielding wall 14 projects upwardly from the upper surface of the conductive substrate 12 and extends so as to surround an essentially rectangular space, i.e., it comprises four upstanding walls that describe four sides of a rectangle.

The lower surface of the upper shielding case 16 tightly abuts the upper surface of the shielding wall 14 so as to define therein an upper shielding chamber 20. On the other hand, the upper surface of the lower shielding case 18 tightly abuts the lower surface of the conductive substrate 12 to define therein a lower shielding chamber 22.

A pair of high-frequency circuits 24 having different functions from each other are packaged in the upper and lower shielding chambers 20 and 22, respectively. In the illustrated embodiment, one of the high-frequency circuits 24 packed in the lower shielding chamber 22 comprises a dielectric resonator 26, while integrated circuit 28 and so forth serve as an oscillating circuit. The other high-frequency circuit 24 packaged in the upper shielding chamber 20 comprises semiconductor device 30, integrated circuits 28 and so forth serve as an amplifying circuit and a frequency converting circuit. In addition, the conductive substrate 12 is provided with a feedthrough terminal 32 which passes through the conductive substrate 12 between the upper and lower shielding chambers 20 and 22 at a predetermined position thereof, so as to allow the high-frequency circuits 24 packaged in the upper and lower shielding chamber 20 and 22 to be electrically connected to each other via the feedthrough terminal 32.

Figure 5:
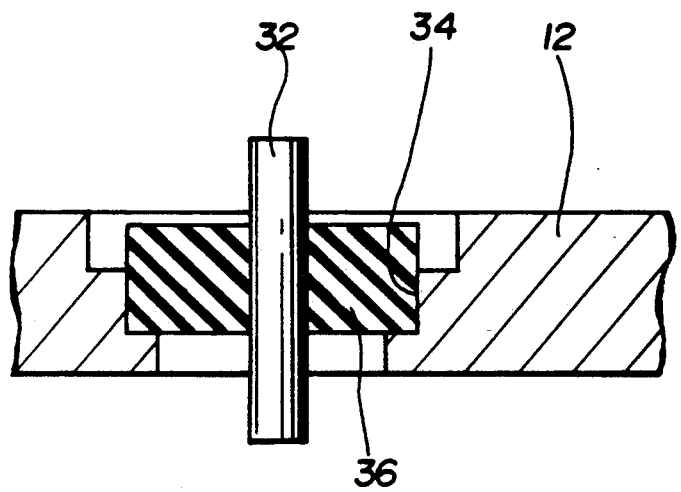
FIG. 5 is a sectional view illustrating a conductive substrate at a location neighboring a feedthrough terminal of the high-frequency circuit package of FIG. 3.

FIG. 5 illustrates a section of the conductive substrate 12 at a location neighboring the feedthrough terminal 32. As shown in FIG. 5, the conductive substrate 12 has a through opening 34 with two step portions. The lower step portion of the through opening 34 supports thereon an essentially cylindrical dielectric 36. The dielectric 36 is secured to the conductive substrate 12 by means of adhesive. The feedthrough terminal 32 is pushed into a through opening formed in the center of the dielectric 36, so that the upper and lower end portions of the feedthrough terminal 32 project from the upper and lower surfaces, respectively.

In addition, as shown in FIG. 3, the shielding wall 14 has a plurality of through openings 38 through which leads 40 extend.

Figure 6:
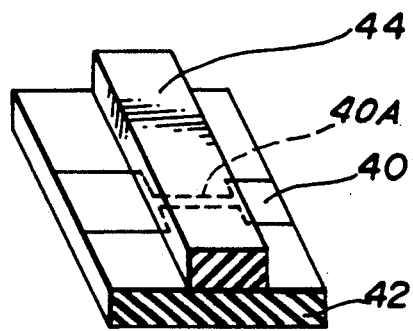
FIG. 6 is a perspective view illustrating a portion neighboring a lead of the high-frequency circuit package of FIG. 3.

As can be seen clearly from FIG. 6, each of the leads 40 is secured to the upper surface of a lower dielectric 42 which is secured to the upper surface of the conductive substrate 12. The lead 40 has a narrow portion 40A at the center thereof. An upper dielectric 44 is secured to the upper surface of the lower dielectric 42 so as to cover the narrow portion of the lead 15. The respective lower and upper dielectrics 42 and 44 are tightly inserted into the corresponding one of the through openings 38. One end portion of the respective leads 40 is arranged within the upper shielding chamber 20, and the other end portion thereof is arranged outside of the upper shielding chamber 20, so that the pair of high-frequency circuits 24 packaged in the upper and lower shielding chambers 20 and 22 can be electrically connected to outside circuits, e.g., circuits packaged in another package.

Furthermore, referring to FIG. 4, a plurality of circuit substrates 46 are mounted on the conductive substrate 12 and are connected to each other by means of bonding wires 48. The dielectric resonator 26 of the high-frequency circuit 24 is supported on the conductive substrate 12 via a supporting member 50.

With this construction, high-frequency waves produced from the oscillating circuit in the lower shielding chamber 22 are transmitted to the frequency converting circuit in the upper shielding chamber 20. These high frequency waves are mixed with high-frequency waves amplified by the amplifying circuit in the upper shielding chamber 20, to be converted into intermediate-frequency waves which are output to outside circuits via the leads 15.

In this process, if the oscillating circuit and the amplifying circuit are housed within the same shielding chamber, high-frequency waves produced from the oscillating circuit are introduced into the amplifying circuit by electromagnetic field bonding, to prevent normal action of the amplifying circuit. Since the high-frequency circuit package of the invention has two shielding chambers, i.e., upper and lower shielding chambers 20 and 22, high-frequency waves can be interrupted by means of the conductive substrate 12 and the shielding cases 16 and 18 so as to not be radiated outside the respective shielding chamber. Therefore, no electromagnetic field bonding is produced, and the amplifying circuit can operate normally.

In addition, since the high-frequency circuit package 10, according to the present invention, has upper and lower shielding chambers 20 and 22 and can house two high-frequency circuits 24 in the respective shielding chambers, packaging density can be improved. Furthermore, since the high-frequency circuit package 10 of the invention can house therein two high-frequency circuits 24 which have different functions and which are related to each other, such as an oscillating circuit and an amplifying circuit, the number of electrical connections necessary for connecting a plurality of packages 10 to each other can be decreased by electrically connecting two high-frequency circuits 24 to each other within the package 10.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A high-frequency circuit package comprising:
   a conductive substrate;
   a first shielding case associated with a first surface of the conductive substrate to define therein a first shielding chamber;
   a second shielding case associated with a surface opposite the first surface of the conductive substrate to define therein a second shielding chamber;
   a pair of high-frequency circuits, one of which is mounted on the first surface of the conductive substrate within the first shielding case, and the other of which is mounted on the opposite surface of the conductive substrate within the second shielding case, said conductive substrate having a through-opening for receiving therein a dielectric, a feed-through terminal extending through a through-opening formed in the dielectric tool aisle one of said high-frequency circuits to be electrically connected to the other high-frequency circuit, said through opening of the conductive substrate having two steps, one of which supports thereon the dielectric.

2. A high-frequency circuit package as set forth in claim 1, wherein one end portion of said feedthrough terminal is arranged within said first shielding chamber, and another end portion of said feedthrough terminal is arranged within said second shielding chamber.

3. A high-frequency circuit package as set forth in claim 1, wherein said first shielding case has a plurality of through openings through which leads extend, said leads connecting said high-frequency circuits to an outside circuit.

4. A high-frequency circuit package as set forth in claim 3, wherein a portion of each of said leads is arranged between upper and lower dielectrics which are received within said through opening of the first shielding case.

5. A high-frequency circuit package as set forth in claim 4, wherein each of said leads has a narrow portion which is arranged between said upper and lower dielectrics.

6. A high-frequency circuit package comprising:
a conductive substrate;
a first shielding case associated with a first surface of the conductive substrate to define therein a first shielding chamber;
a second shielding case associated with a surface opposite the first surface of the conductive substrate to define therein a second shielding chamber;
a pair of high-frequency circuits, one of which is mounted on the first surface of the conductive substrate within the first shielding case, and the other of which is mounted on the opposite surface of the conductive substrate within the second shielding case;
a feed through terminal which extends through the conductive substrate to allow one of said high-frequency circuits to be electrically connected to the other high-frequency circuit; and
a through opening in said conductive substrate for receiving therein a dielectric, said dielectric having a feed-through terminal extending through a through-opening formed in the dielectric to allow one of said high-frequency circuits to be electrically connected to the other high-frequency circuit, said through opening of the conductive substrate having two steps, one of which supports thereon the dielectric.

7. A high-frequency circuit package as set forth in claim 6, wherein said first shielding case has a plurality of through openings through which leads extend, said leads connecting said high-frequency circuits to an outside circuit.

8. A high-frequency circuit package as set forth in claim 7, wherein a portion of each of said leads is arranged between upper and lower dielectrics which are received within said through opening of the first shielding case.

9. A high-frequency circuit package as set forth in claim 8, wherein each of said leads has a narrow portion which is arranged between said upper and lower dielectrics.

10. A high-frequency circuit package comprising:
a conductive substrate;
a first shielding case associated with a first surface of the conductive substrate to define therein a first shielding chamber;
a second shielding case associated with a surface opposite the first surface of the conductive substrate to define therein a second shielding chamber;
a pair of high-frequency circuits, one of which is mounted on the first surface of the conductive substrate within the first shielding case, and the other of which is mounted on the opposite surface of the conductive substrate within the second shielding case;
a feed through terminal which extends through the conductive substrate to allow one of said high-frequency circuits to be electrically connected to the other high-frequency circuit;
a through opening in said conductive substrate for receiving therein a dielectric, said dielectric having a feed-through terminal extending through a through opening formed in the dielectric to allow one of said high-frequency circuits to be electrically connected to the other high-frequency circuit, said through opening of the conductive substrate having two steps, one of which supports therein the dielectric; and
a plurality of through openings and said shielding case through said leads extend, said leads connecting said high-frequency circuits to an outside circuit.

11. A high-frequency circuit package as set forth in claim 10, wherein one end portion of said feedthrough terminal is arranged within said first shielding chamber, and another end portion of said feedthrough terminal is arranged within said second shielding chamber.

12. A high-frequency circuit package as set forth in claim 11, wherein a portion of each of said leads is arranged between upper and lower dielectrics which are received within said through opening of the first shielding case.

13. A high-frequency circuit package as set forth in claim 11, wherein each of said leads has a narrow portion which is arranged between said upper and lower dielectrics.

* * * * *